(12) United States Patent
Chainer et al.

(10) Patent No.: US 12,300,577 B2
(45) Date of Patent: May 13, 2025

(54) HETEROGENEOUS INTEGRATED MULTI-CHIP COOLER MODULE

(71) Applicant: International Business Machines Corporation, Armonk, NY (US)

(72) Inventors: Timothy J. Chainer, Putnam Valley, NY (US); Todd Edward Takken, Brewster, NY (US); Joshua M. Rubin, Albany, NY (US); Arvind Kumar, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 82 days.

(21) Appl. No.: 18/092,136

(22) Filed: Dec. 30, 2022

(65) Prior Publication Data

US 2024/0222223 A1 Jul. 4, 2024

(51) Int. Cl.
*H01L 23/46* (2006.01)
*H01L 23/367* (2006.01)
*H01L 23/433* (2006.01)
*H01L 25/065* (2023.01)

(52) U.S. Cl.
CPC .......... *H01L 23/46* (2013.01); *H01L 23/3677* (2013.01); *H01L 23/4332* (2013.01); *H01L 25/0655* (2013.01)

(58) Field of Classification Search
CPC ..... H05K 1/0203–0204; H05K 1/0207; H05K 1/0209; H05K 1/181; H05K 7/1488–1489; H05K 7/20154; H05K 7/2029; H05K 7/20236; H05K 7/20254; H05K 7/20272; H05K 7/20309–20327; H05K 7/20509; H05K 7/20627–20645; H05K 7/20663; H05K 7/20681; H05K 7/207; H05K 7/20709; H05K 7/20718; H05K 7/20736; H05K 7/20754; H05K 7/20763–20781; H05K 7/20818; H05K 7/20827; H05K 7/20836; H05K 7/20881; H05K 7/209; H05K 7/20936; H01L 23/427; H01L 23/46; H01L 23/467; H01L 23/473; H01L 23/31; H01L 23/34; H01L 23/36; H01L 23/3677; H01L 23/3733; H01L 23/3737; H01L 23/4006; H01L 23/405; H01L 23/4332; H01L 2023/4062; H01L 2023/4087; H01L 25/0655
See application file for complete search history.

(56) References Cited

U.S. PATENT DOCUMENTS 4,759,403 A * 7/1988 Flint .................... H01L 23/4332
257/E23.091
4,949,219 A * 8/1990 Moriizumi .......... H01L 23/4332
257/E23.091
5,491,363 A * 2/1996 Yoshikawa ......... H01L 23/4332
257/E23.091

(Continued)

*Primary Examiner* — Amir A Jalali
(74) *Attorney, Agent, or Firm* — Yuanmin Cai; Otterstedt & Kammer PLLC

(57) ABSTRACT

An exemplary apparatus includes a substrate; a plurality of chips mounted onto the substrate; a plurality of cold plates corresponding to the plurality of chips; means for pressing each of the cold plates toward a corresponding one of the chips; means for delivering coolant flow to the cold plates; and means for adjusting the cooling power of the plurality of cold plates, responsive to at least one sensed parameter of the plurality of chips.

20 Claims, 4 Drawing Sheets

(56) References Cited

U.S. PATENT DOCUMENTS

| | | | |
|---|---|---|---|
| 5,537,291 A * | 7/1996 | Onodera | H01L 23/473 |
| | | | 257/E23.098 |
| 6,778,393 B2 * | 8/2004 | Messina | H01L 23/4338 |
| | | | 361/689 |
| 7,948,077 B2 | 5/2011 | Andry | |
| 8,464,781 B2 * | 6/2013 | Kenny | F28F 13/06 |
| | | | 165/80.4 |
| 8,925,623 B2 | 1/2015 | Sauer | |
| 9,265,176 B2 | 2/2016 | Arvelo | |
| 9,313,923 B2 | 4/2016 | Davis | |
| 9,997,377 B2 | 6/2018 | Choudhury | |
| 11,158,565 B2 | 10/2021 | Karidis | |
| 2014/0146845 A1 * | 5/2014 | Chainer | G01K 15/005 |
| | | | 374/1 |
| 2016/0201558 A1 * | 7/2016 | Pal | F02C 7/12 |
| | | | 60/39.83 |
| 2016/0270259 A1 * | 9/2016 | Chainer | H05K 7/20272 |
| 2017/0181328 A1 * | 6/2017 | Shelnutt | G06F 1/20 |

* cited by examiner

HETEROGENEOUS INTEGRATED MULTI-CHIP COOLER MODULE

BACKGROUND

The present invention relates to the electrical, electronic, and computer arts, and more specifically, to cooling systems for very large scale integrated (VLSI) circuit assemblies.

As Moore's Law scaling of transistors has slowed, in order to maintain computer system performance scaling, the industry has moved to heterogeneous integration of chips into a System in Package (SiP). An exemplary SiP 100, as shown in FIG. 1, includes multiple chips and chip stacks arranged on a substrate, with some of the chips or chip stacks protruding from the substrate to different heights than others. The chips may be manufactured in different technologies (e.g. CMOS, SiGe) with varying thermal power density and chip temperature requirements; for example CPUs, GPUs, Optical Interconnect, RF, and the like. The chips may be arranged as multiple dice in a vertical stack (3D) 1; as multiple dice packaged side by side on an interposer (2.5D) 2; or as single dice (2D) 3, 4. Cooling the chips and chip stacks in a SiP poses challenges, such as how to make a cooling system conform to all of the multiple components of differing heights, different power levels and different temperature requirements.

SUMMARY

Principles of the invention provide techniques for a heterogeneous integrated multi-chip cooler module.

In one aspect, an exemplary apparatus includes a fluid manifold that has a principal inlet, a principal outlet, an inlet chamber, an outlet chamber, and a chip-facing surface that has matching pluralities of subsidiary outlets and inlets. The principal inlet and each subsidiary outlet fluidly connects to the inlet chamber and the principal outlet and each subsidiary inlet fluidly connects to the outlet chamber. The apparatus also includes a plurality of pairs of bellows that are respectively attached and fluidly connected to corresponding pairs of the subsidiary outlets and inlets; and a plurality of cold plates that each are fluidly connected between one of the pairs of bellows.

According to another aspect, an exemplary method is provided for cooling a multi-chip module that comprises a plurality of chips of differing vertical heights and operating temperature specifications. The method includes assembling a plurality of cold plates to a manifold; the assembling comprises connecting a first plurality of bellows between inlets of the cold plates and an inlet chamber of the manifold, connecting a second plurality of bellows between outlets of the cold plates and an outlet chamber of the manifold, and inserting springs between the cold plates and the manifold. The method also includes attaching the manifold and cold plates to the multi-chip module by a frame that holds the manifold with each cold plate pressed against a corresponding chip of the multi-chip module; and flowing a coolant through the manifold and the cold plates.

According to another aspect, an exemplary apparatus includes a substrate; a plurality of chips mounted onto the substrate; a plurality of cold plates corresponding to the plurality of chips; means for pressing each of the cold plates toward a corresponding one of the chips; means for delivering coolant flow to the cold plates; and means for adjusting the cooling power of the plurality of cold plates, responsive to at least one sensed parameter of the plurality of chips.

In view of the foregoing, techniques of the present invention can provide substantial beneficial technical effects. For example, one or more embodiments provide one or more of:

Enhanced thermal isolation between chips of a multi-chip module that is cooled by multiple cold plates.

Enhanced cooling capability for individual chips in the multi-chip module.

Customization of the cold plates for individual chips in the multi-chip module based on the chip power map and temperature requirements.

Ease of assembly for a multi-chip cooler module that includes multiple cold plates.

Accommodation of height variation among chips of a multi-chip module that is cooled by one or more cold plates.

Control of coolant flow responsive to chip temperature or compute load.

Control of a thermoelectric cooling element responsive to chip temperature or compute load.

Some embodiments may not have these potential advantages and these potential advantages are not necessarily required of all embodiments. These and other features and advantages of the present invention will become apparent from the following detailed description of illustrative embodiments thereof, which is to be read in connection with the accompanying drawings.

DETAILED DESCRIPTION

Exemplary embodiments provide a thermal solution that can adapt to 2D, 2.5D, and 3D chip arrangements that have a) different power levels, b) different temperature requirements, and c) different heights.

a) Thermal Isolation

Figure 1:
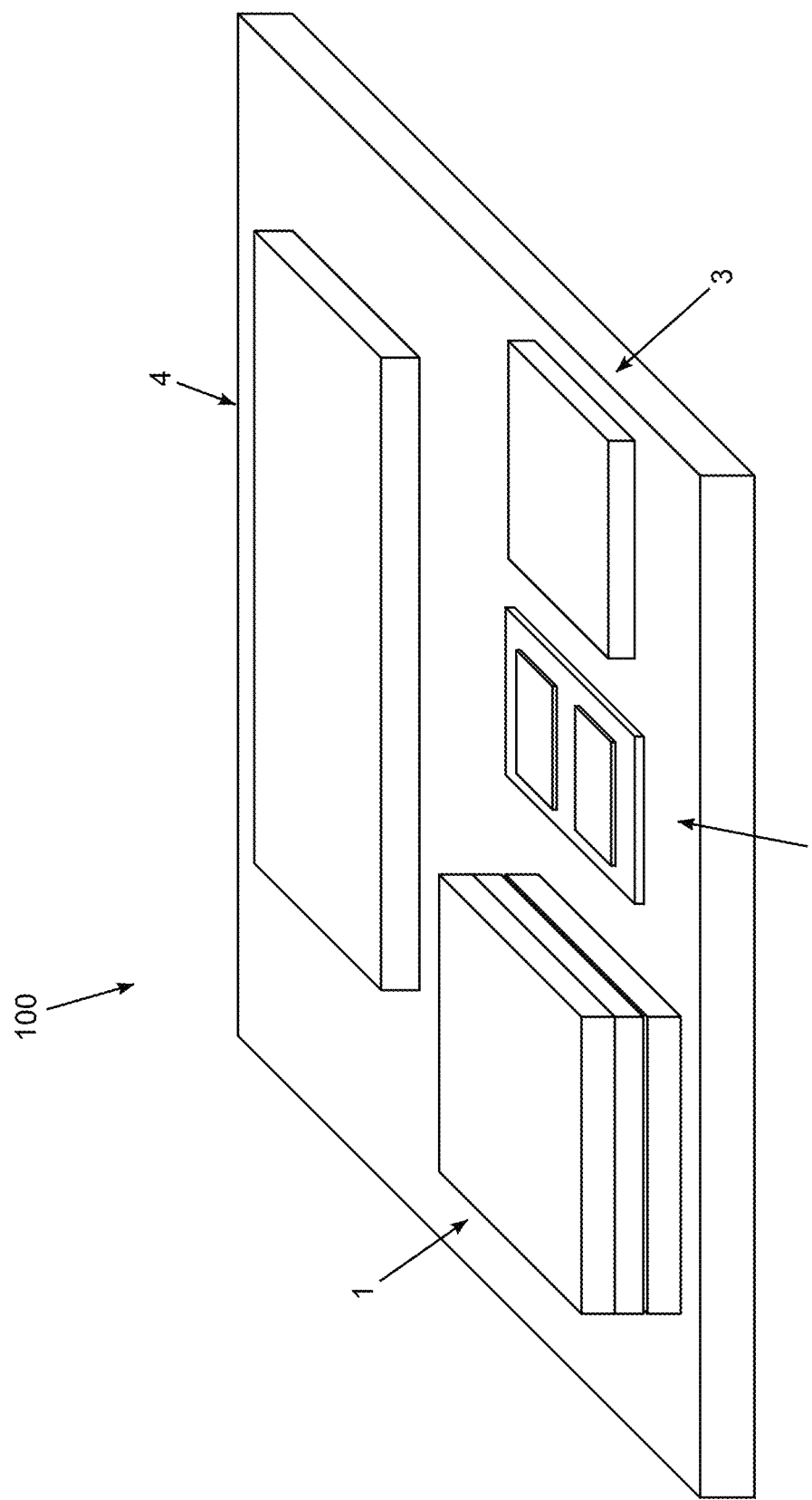
FIG. 1 depicts, in a schematic, a prior art system in package chip module.
Figure 2:
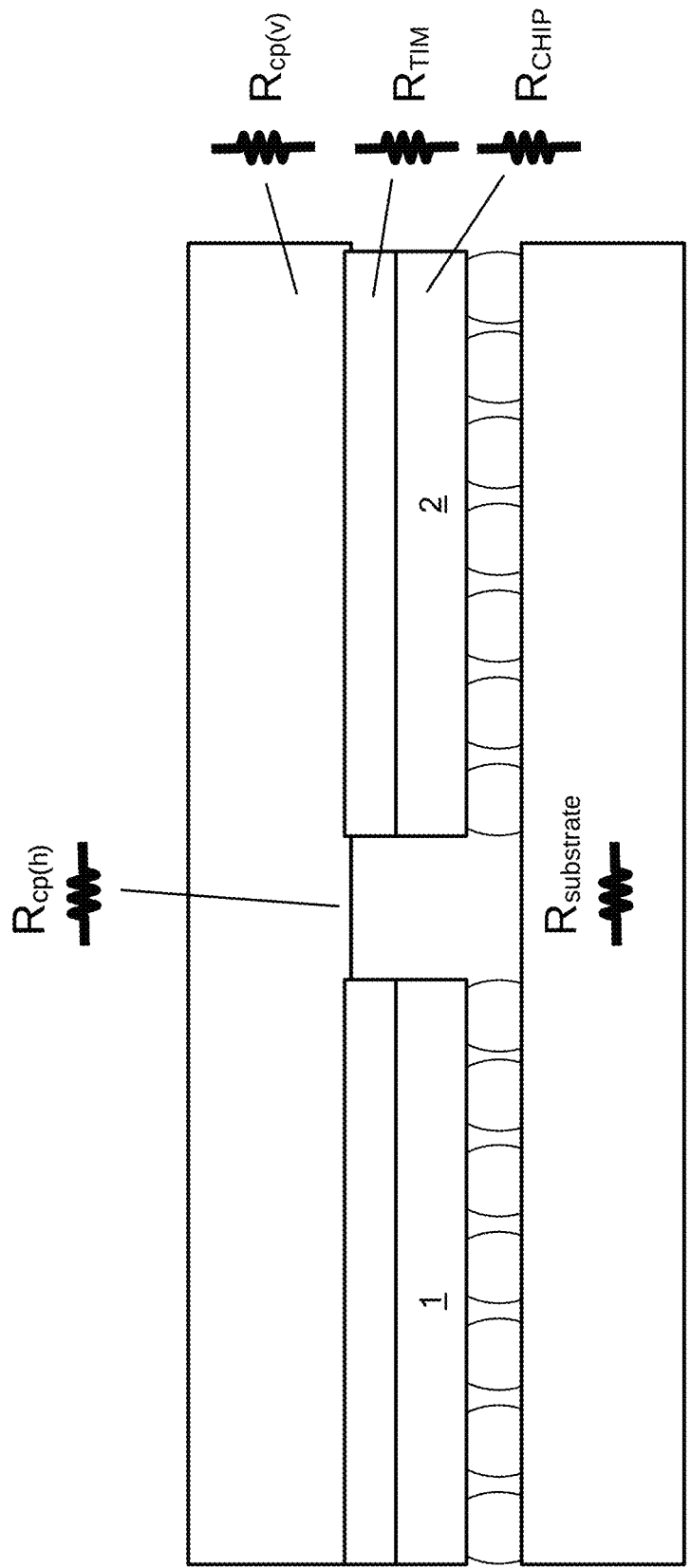
FIG. 2 depicts, in a schematic, how to find thermal resistance between a chip and its coolant.

To achieve chip temperature requirements, a cold plate is provided for each individual chip in the SIP, with approximate thermal isolation between chips. Referring to FIG. 1 and FIG. 2, the temperatures of the four chip stacks 1, 2, 3, 4 can be described as shown below, where T is the chip temperature, P is the chip power dissipation, and R is the thermal resistance.

$$\begin{bmatrix} T1 \\ T2 \\ T3 \\ T4 \end{bmatrix} = \begin{bmatrix} P1 \\ P2 \\ P3 \\ P4 \end{bmatrix} \times \begin{bmatrix} R11 & R12 & R13 & R14 \\ R21 & R22 & R23 & R24 \\ R31 & R32 & R33 & R34 \\ R41 & R42 & R43 & R44 \end{bmatrix}$$

For example the temperature of chip 1 is given by $$T1 = P1 \times R11 + P2 \times R12 + P3 \times R13 + P4 \times R14$$

where the "self" thermal resistance between chip 1 and a cold plate (not shown) is R11. The "mutual" thermal resistance between chip 1 and the other three chips, chip 2, chip 3, and chip 4 is given by R12, R13 and R14 respectively. Typically, R11 is the thermal resistance between the chip active circuits and the cold plate fluid which is given by the sum of thermal resistance through chip 1 ($R_{CHIP}$), the thermal interface material between chip 1 and the cold plate ($R_{TIM}$), and the thermal resistance of the cold plate to the coolant ($R_{cp(v)}$). Meanwhile, R12 is given by the total lateral thermal resistance between chip 1 and chip 2, in the SiP which includes the lateral thermal resistance in the manifold (which holds the cold plates) and the substrate. The total lateral thermal resistance is given by $$1/R_{lateral\ total} = 1/R_{lateral\ manifold} + 1/R_{lateral\ substrate}.$$

Typically, the material and design of the cold plate is a major component of lowering the thermal resistance between chips and the coolant. The thermal interface material (e.g., indium foil, thermal grease) is another component. To reduce thermal crosstalk between chip 1 and the adjacent chips 2, 3, 4, it is appropriate to reduce the thermal resistance R11 between chip 1 and the coolant and to increase the thermal resistances R12, R13 and R14 between chip 1 and chips 2, 3, 4 respectively.

A typical cold plate is mounted onto several chips, in which the coolant temperature increases as the coolant flows from inlet to outlet as it absorbs heat. This results in chips closer to the inlet having a lower coolant temperature than chips which are downstream from the inlet. In addition, as cold plates are fabricated of high thermal conductivity materials such as copper, placing a single cold plate onto several chips increases lateral thermal conduction between chips which reduces the lateral thermal resistance.

Figure 3:
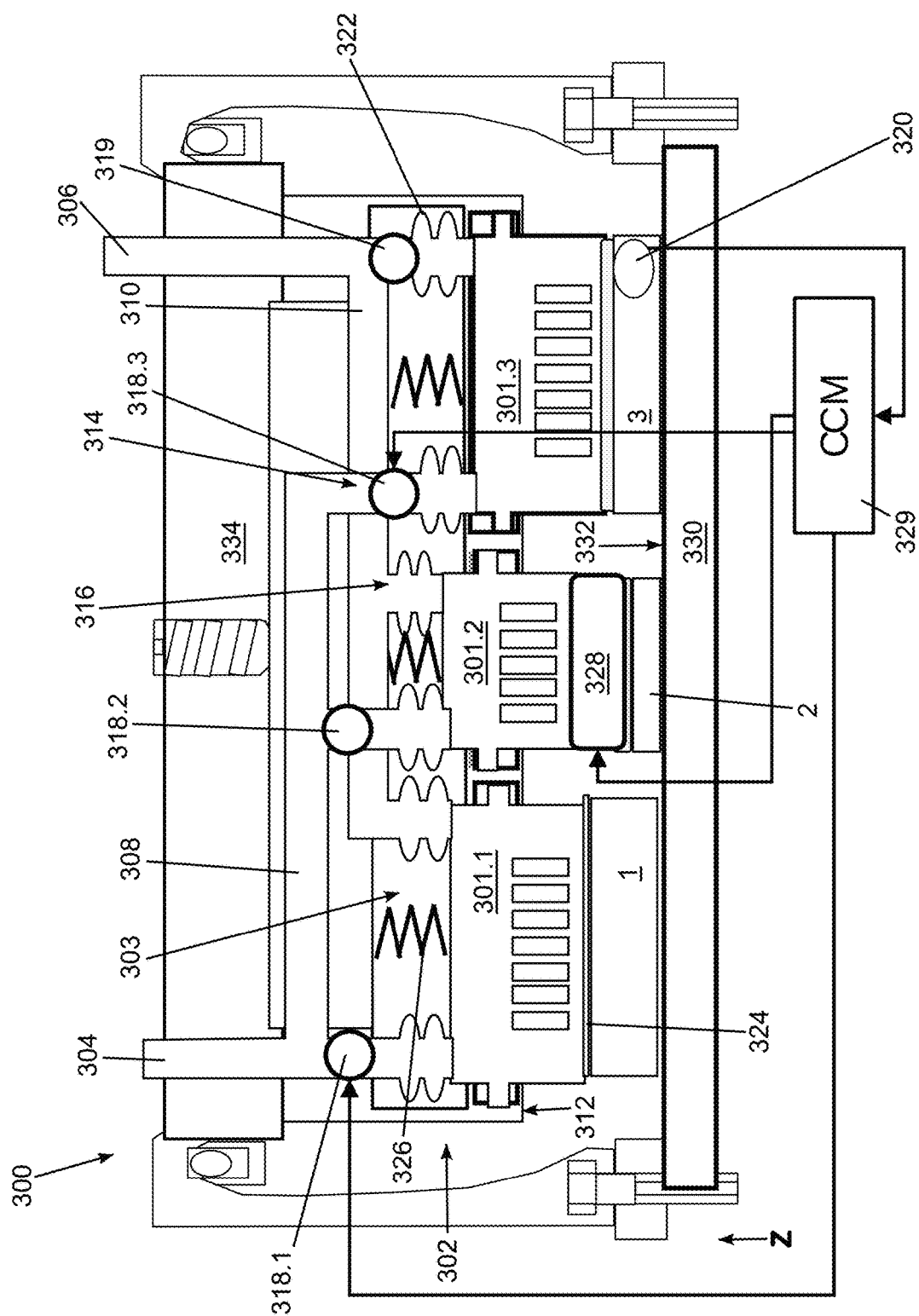
FIG. 3 depicts, in a schematic, a multi-chip module cooler, according to exemplary embodiments.

A greater lateral thermal resistance can be achieved in a multi-chip cooler module 300, as shown in FIG. 3, by creating separate microchannel cold plate structures 301.1, 301.2, 301.3, etc., which are placed in a low thermal conductivity manifold structure 302 to reduce thermal cross talk between the microchannel cooling elements. The manifold 302 distributes a coolant fluid, which may be a single phase liquid such as water or a fluid which changes phase from liquid to vapor as heat is removed from a chip and absorbed into the fluid which is referred to as two phase cooling. The manifold 302 has a principal inlet 304, a principal outlet 306, an inlet chamber 308, an outlet chamber 310, and a chip-facing surface 312 that has matching pluralities of subsidiary inlets 314 and outlets 316. Each outlet fluidly connects to the outlet chamber and each inlet fluidly connects to the inlet chamber. The subsidiary "outlets" properly are inlets to the manifold and outlets from the cold plates. The subsidiary "inlets" properly are outlets from the manifold and inlets to the cold plates.

As individual cold plates are placed on each chip in the SiP, the cold plate design may be specifically designed to optimize the thermal management requirement for each die. For example one cold plate may have parallel channels, and a second cold plate may have radially expanding channels, and a third cold plate could use a pin field.

b) Fluid Distribution/Control

The manifold 302 distributes the fluid flow into each microchannel cold plate. Valves 318.1, 318.2, 318.3, etc. can be provided to control the flow rate. Each valve may be fixed or variable. The valves can be provided in outlets or inlets.

Electrically actuatable variable valves are known in microfluidic technology. Some such valves are actuated by resistive heating of a valve stem or diaphragm. Other suitable types of valves with appropriate valve actuators could be employed. In the variable case, the flow rate may be dynamically controlled to vary the fluid flow rate based upon the chip temperature or chip power level. Thus, one or more of the chips may be instrumented with a sensor 320, e.g., a temperature sensor such as a thermocouple, Resistance Temperature Detector (RTD), thermistor, or the like.

In a first case, if the chip 1 temperature approaches a target threshold, then the flow to chip 1 may be increased. In a second case, if chip 1 is not powered, then the flow to chip 1 may be turned off to direct fluid to the other operational chips in the SIP. Alternative control methods may be implemented for each of the individual chips in the SIP.

c) Z Height Variation

A second benefit of the cold plate is to conform to variations in the heights of the different chips in the SIP along a Z direction (shown in FIG. 3). This allows the thermal interface material to maintain a constant thickness, as the cold plate adjusts to the chip height, rather than filling in height variations with additional thermal interface material (which would add to the overall thermal resistance between the chip and coolant as shown in FIG. 3). Height conformance is achieved by having flexible fluidic connections such as metal bellows 322 to allow for vertical motion of the microchannel coolers 301.1, 301.2, 301.3, etc. To ensure that the microchannel cooler has sufficient mechanical loading against the thermal interface material 324, a spring 326 can be deployed between the manifold 302 and the cold plate 301.1, 301.2, 301.3, etc. This allows the thermal interface material to maintain a constant thickness, as the cold plate adjusts to the chip height. In one or more embodiments, both the bellows 322 and the springs 326 are housed within a cavity 303 of the manifold 302.

d) Secondary Cooling Elements

In cases where one or more of the chips in the SIP are to be kept at a temperature below the inlet fluid temperature, a thermoelectric cooler 328 may be placed between the microchannel cold plate and the thermal interface material to lower chip temperature below the cold plate temperature. A thermoelectric cooler, also known as a Peltier device, is a solid-state active heat pump that uses the Peltier effect to transfer heat from one side of the device to the other. It works by applying a voltage across two electrodes, which creates a temperature difference between the two sides of the device. This temperature difference can be used to cool or heat a small area. Thermoelectric coolers are commonly used in a variety of applications, such as cooling electronic components, scientific instruments, and medical devices. They are known for their high efficiency, low power consumption, and lack of moving parts, which makes them relatively quiet and durable.

The thermoelectric cooler may also be dynamically controlled based upon the operating conditions. To assist in dynamic control, instrumentation 320 may be placed on the chip where the thermoelectric cooler 328 has been placed. In a first case, when compute load of chip 2 increases, the cooling control module (CCM) 329 increases current to the thermoelectric cooler 328. In a second case, when chip 2 is under low compute load, the cooling control module 329 reduces current to the thermoelectric cooler 328.

While a thermocouple has been mentioned as an example of instrumentation 320, surface temperature is a lagging indicator. Another option for a leading indicator is to monitor a chip's power draw, e.g., according to conventional modes of monitoring processor usage ratio between 0% and 100%. The ordinary skilled worker will appreciate that CPU usage can be monitored without placing instrumentation on the chip surface. Thus, the illustrated instrumentation 320 can be present on the chip as a physical element, or can be implemented elsewhere in software.

Figure 4:
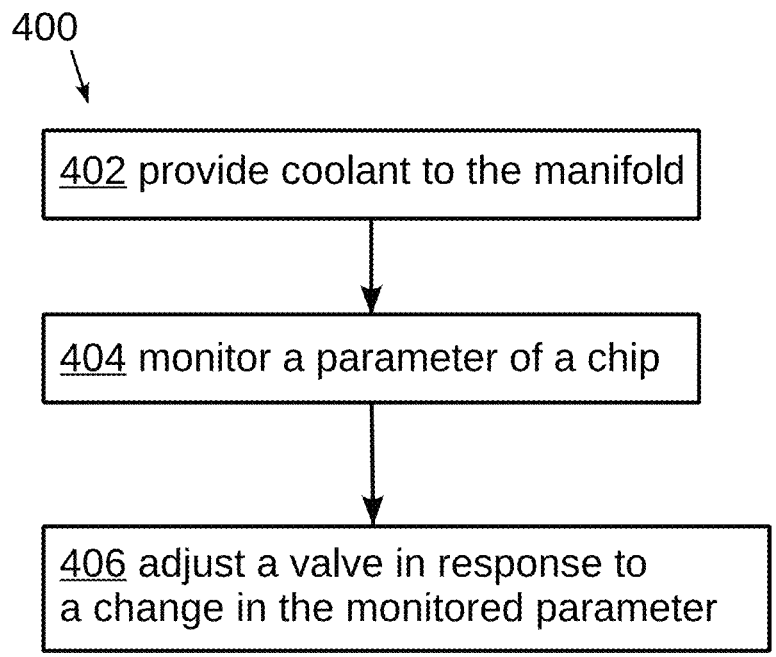
FIG. 4 depicts, in a flow chart, steps of a method for operating the multi-chip module cooler that is shown in FIG. 3, according to exemplary embodiments.
Figure 5:
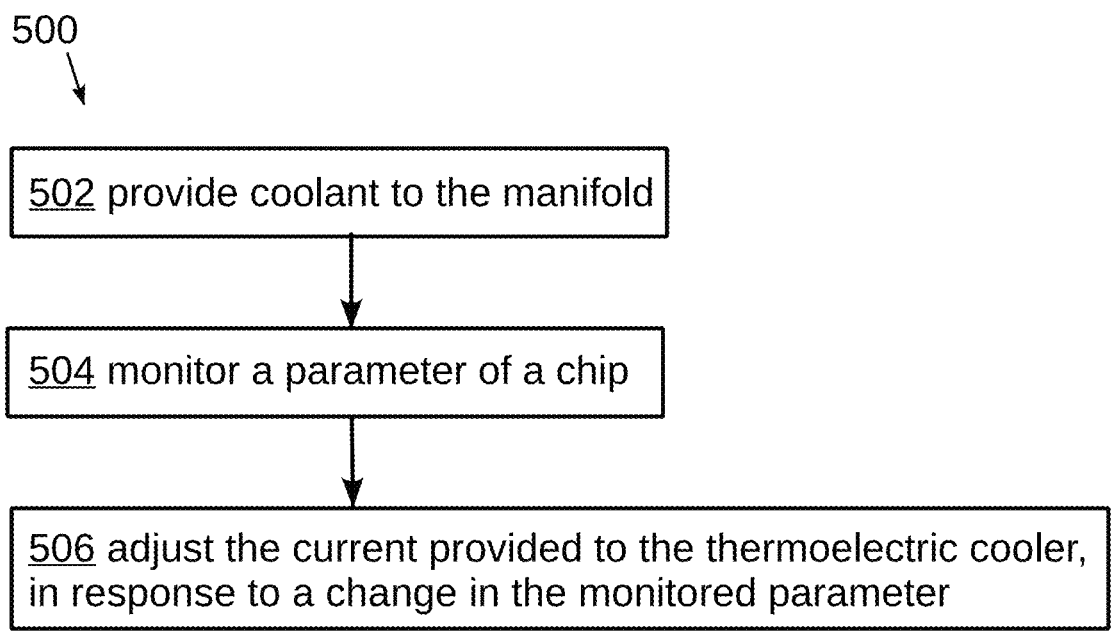
FIG. 5 depicts, in a flow chart, steps of a method for operating the multi-chip module cooler that is shown in FIG. 3, according to exemplary embodiments.

Thus, in one or more embodiments, the cooling control module 329 receives signals from instrumentation associated with one or more of the chips and adjusts the operation of one or more of the valves or thermoelectric cooler(s) in response to the signals from the instrumentation. The CCM 329 operates according to logic as shown in FIG. 4 or FIG. 5. For example, if compute load on a chip increases, or if temperature of the chip increases, then the CCM 329 increases coolant flow through a valve to the chip's cold plate and/or increases electrical current supplied to the chip's thermoelectric cooler. On the other hand, if compute load or temperature of a chip decreases, then the CCM 329 reduces coolant flow through a valve to the chip's cold plate and/or reduces electrical current supplied to the chip's thermoelectric cooler. The CCM 329 can be implemented in hardware, in software, or in a combination thereof.

In one or more embodiments, the multi-chip cooler module 300 is mounted onto a substrate 330 that has an upper surface 332. The chips 1, 2, 3, are mounted on the upper surface of the substrate. A frame 334 connects the fluid manifold 302 to the substrate 330 with the chip-facing surface 312 of the fluid manifold facing toward the substrate, and with each of the cold plates 301 aligned to one of the chips.

Thus, the manifold 302, the frame 334, and the springs 326 together provide means for pressing the cold plates 301.1, 301.2, 301.3, etc. toward the chips 1, 2, 3, etc. The valves 318.1, 318.2, 318.3, etc. and the bellows 322 provide means for delivering coolant flow to the cold plates 301.1, 301.2, 301.3, etc. The valves 318.1, 318.2, 318.3, etc., the instrumentation 320, the thermoelectric cooler 328, and the cooling control module 329 provide means for adjusting the cooling power of the plurality of cold plates, responsive to at least one sensed parameter of the plurality of chips.

FIG. 4 depicts, in a flow chart, steps of a method 400 that is implemented by the cooling control module 329 for operating the multi-chip module cooler 300 that is shown in FIG. 3, according to exemplary embodiments. At 402, provide coolant to the manifold 302. At 404, monitor a parameter of a chip (e.g., temperature, or compute load). At 406, adjust a valve (e.g., one of the flow control valves 318.1, 318.2, 318.3, etc.), in response to a change in the monitored parameter. In one or more embodiments, one way valves 319 may be provided at the cold plate outlets 316 to prevent backflow/mixing of warmer fluid. Outlet channel size can be increased as appropriate to lower exit pressure drop.

FIG. 5 depicts, in a flow chart, steps of a method 500 that is implemented by the cooling control module 329 for operating the multi-chip module cooler 300 that is shown in FIG. 3, according to exemplary embodiments. At 502, provide coolant to the manifold 302. At 504, monitor a parameter of a chip (e.g., temperature, or compute load). At 506, adjust the current provided to the thermoelectric cooler 328, in response to a change in the monitored parameter.

Given the discussion thus far, it will be appreciated that, in general terms, an exemplary apparatus 300, according to an aspect of the invention, includes a fluid manifold 302 that has a principal inlet 304, a principal outlet 306, an inlet chamber 308, an outlet chamber 310, and a chip-facing surface 312 that has matching pluralities of subsidiary outlets 314 and inlets 316. The principal inlet and each subsidiary outlet fluidly connects to the inlet chamber and the principal outlet and each subsidiary inlet fluidly connects to the outlet chamber. The apparatus 300 also includes a plurality of pairs of bellows 322 that are respectively attached and fluidly connected to corresponding pairs of the subsidiary outlets and inlets; and a plurality of cold plates 301.1, 301.2, 301.3 that each are fluidly connected between one of the pairs of bellows.

In one or more embodiments, the apparatus 300 also includes a spring 326 that is captured between one of the cold plates and the chip-facing surface of the fluid manifold.

In one or more embodiments, the apparatus 300 also includes an inlet flow control valve 318.1, 318.2, or 318.3 that fluidly connects one of the subsidiary outlets to the inlet chamber.

In one or more embodiments, the apparatus 300 also includes a cooling control module 329 that is electrically connected to the inlet flow control valve.

In one or more embodiments, the apparatus 300 also includes a one way valve 319 that fluidly connects one of the subsidiary inlets to the outlet chamber.

In one or more embodiments, at least one of the cold plates comprises a pin field or a microchannel cooler.

In one or more embodiments, each of the cold plates has a chip-facing surface, and a thermoelectric cooler 328 is mounted to the chip-facing surface of one of the cold plates. In one or more embodiments, the cooling control module 329 is electrically connected to the thermoelectric cooler.

In one or more embodiments, the apparatus 300 also includes a substrate 330 that has an upper surface 332; a plurality of chips 1, 2, 3 that are mounted on the upper surface of the substrate; and a frame 334 that connects the fluid manifold to the substrate with the chip-facing surface of the fluid manifold facing toward the substrate, and with each of the cold plates pressed toward one of the plurality of chips. In one or more embodiments, the apparatus also includes thermal interface material 324 between each cold plate and a corresponding one of the plurality of chips.

In one or more embodiments, a material of the fluid manifold has a thermal conductivity that is less than 10% of a thermal conductivity of a material of the cold plates.

According to another aspect, an exemplary method is provided for cooling a multi-chip module that comprises a plurality of chips of differing vertical heights and operating temperature specifications. The method includes assembling a plurality of cold plates to a manifold; the assembling comprises connecting a first plurality of bellows between inlets of the cold plates and an inlet chamber of the manifold, connecting a second plurality of bellows between outlets of the cold plates and an outlet chamber of the manifold, and inserting springs between the cold plates and the manifold. The method also includes attaching the manifold and cold plates to the multi-chip module by a frame that holds the manifold with each cold plate pressed against a corresponding chip of the multi-chip module; and flowing a coolant through the manifold and the cold plates.

In one or more embodiments, the method also includes, at 404, sensing a parameter of one of the chips; and, at 406, operating a flow control valve of the manifold to regulate coolant flow through one of the cold plates that is attached to the one of the chips, responsive to the sensed parameter.

In one or more embodiments, sensing the parameter comprises monitoring a temperature sensor. In one or more embodiments, sensing the parameter comprises monitoring a compute load.

In one or more embodiments, the method also includes, at 504, sensing a parameter of one of the chips; and, at 506, adjusting electrical current delivered to a thermoelectric cooler that is attached to the one of the chips, responsive to the sensed parameter.

In one or more embodiments, sensing the parameter comprises monitoring a thermocouple. In one or more embodiments, sensing the parameter comprises monitoring a compute load.

According to another aspect, an exemplary apparatus includes a substrate; a plurality of chips mounted onto the substrate; a plurality of cold plates corresponding to the plurality of chips; means for pressing each of the cold plates toward a corresponding one of the chips; means for delivering coolant flow to the cold plates; and means for adjusting the cooling power of the plurality of cold plates, responsive to at least one sensed parameter of the plurality of chips.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus comprising:
   a fluid manifold that has a principal inlet, a principal outlet, an inlet chamber, an outlet chamber, and a chip-facing surface that has matching pluralities of subsidiary outlets and inlets, wherein the principal inlet and each subsidiary outlet fluidly connects to the inlet chamber and the principal outlet and each subsidiary inlet fluidly connects to the outlet chamber;
   a plurality of pairs of bellows that are respectively attached and fluidly connected to corresponding pairs of the subsidiary outlets and inlets;
   a plurality of cold plates that each are fluidly connected between one of the pairs of bellows; and
   at least one spring that is positioned between the outlet chamber and a cold plate from the plurality of cold plates.

2. The apparatus of claim 1, wherein the at least one spring is captured between one of the cold plates and the chip-facing surface of the fluid manifold.

3. The apparatus of claim 1, further comprising an inlet flow control valve that fluidly connects one of the subsidiary outlets to the inlet chamber.

4. The apparatus of claim 3, further comprising a cooling control module is electrically connected to the inlet flow control valve.

5. The apparatus of claim 1, further comprising a one way valve that fluidly connects one of the subsidiary inlets to the outlet chamber.

6. The apparatus of claim 1, wherein at least one of the cold plates comprises a pin field.

7. The apparatus of claim 1, wherein at least one of the cold plates comprises a microchannel cooler.

8. The apparatus of claim 1, wherein each of the cold plates has a chip-facing surface, further comprising a thermoelectric cooler that is mounted to the chip-facing surface of one of the cold plates.

9. The apparatus of claim 8, further comprising a cooling control module that is electrically connected to the thermoelectric cooler.

10. The apparatus of claim 1, further comprising:
    a substrate that has an upper surface;
    a plurality of chips that are mounted on the upper surface of the substrate; and
    a frame that connects the fluid manifold to the substrate with the chip-facing surface of the fluid manifold facing toward the substrate, and with each of the cold plates pressed toward one of the plurality of chips.

11. The apparatus of claim 10, further comprising thermal interface material between each cold plate and a corresponding one of the plurality of chips.

12. The apparatus of claim 1, wherein a material of the fluid manifold has a thermal conductivity that is less than 10% of a thermal conductivity of a material of the cold plates.

13. A method for cooling a multi-chip module that comprises a plurality of chips of differing vertical heights and operating temperature specifications, the method comprising:
    assembling a plurality of cold plates to a manifold, wherein the assembling comprises connecting a first plurality of bellows between inlets of the cold plates and an inlet chamber of the manifold, connecting a second plurality of bellows between outlets of the cold plates and an outlet chamber of the manifold, and inserting springs between the cold plates and the manifold, wherein at least one spring is inserted between the outlet chamber and a cold plate;
    attaching the manifold and cold plates to the multi-chip module by a frame that holds the manifold with each cold plate pressed against a corresponding chip of the multi-chip module; and
    flowing a coolant through the manifold and the cold plates.

14. The method of claim 13, further comprising:
    sensing a parameter of one of the chips; and
    operating a flow control valve of the manifold to regulate coolant flow through one of the cold plates that is attached to the one of the chips, responsive to the sensed parameter.

15. The method of claim 14, wherein sensing the parameter comprises monitoring a temperature sensor.

16. The method of claim 14, wherein sensing the parameter comprises monitoring a compute load.

17. The method of claim 13, further comprising:
    sensing a parameter of one of the chips; and
    adjusting electrical current delivered to a thermoelectric cooler that is attached to the one of the chips, responsive to the sensed parameter.

18. The method of claim 17, wherein sensing the parameter comprises monitoring a thermocouple.

19. The method of claim 17, wherein sensing the parameter comprises monitoring a compute load.

20. An apparatus that comprises:
    a substrate;
    a plurality of chips mounted onto the substrate;
    a plurality of cold plates corresponding to the plurality of chips;
    at least one spring for pressing each of the cold plates toward a corresponding one of the chips;
    a manifold for delivering coolant flow to the cold plates, the manifold comprising an inlet chamber and an outlet chamber that are both connected to the plurality of cold plates, wherein the at least one spring is positioned between the outlet chamber and a cold plate from the
plurality of cold plates; and means for adjusting the cooling power of the plurality of
cold plates, responsive to at least one sensed parameter
of the plurality of chips.

\* \* \* \* \*